United States Patent
Pandev et al.

(10) Patent No.: US 10,030,965 B2
(45) Date of Patent: Jul. 24, 2018

(54) MODEL-BASED HOT SPOT MONITORING

(71) Applicant: KLA-Tencor Corporation, Milpitas, CA (US)

(72) Inventors: Stilian Ivanov Pandev, Santa Clara, CA (US); Sanjay Kapasi, Austin, TX (US); Mark D. Smith, Austin, TX (US); Ady Levy, Sunnyvale, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/148,116

(22) Filed: May 6, 2016

(65) Prior Publication Data

US 2016/0327605 A1    Nov. 10, 2016

Related U.S. Application Data

(60) Provisional application No. 62/158,618, filed on May 8, 2015.

(51) Int. Cl.
*G01B 11/00* (2006.01)
*H01L 21/66* (2006.01)

(52) U.S. Cl.
CPC .............. *G01B 11/00* (2013.01); *H01L 22/12* (2013.01); *H01L 22/20* (2013.01)

(58) Field of Classification Search
CPC ...... G01R 31/26; G01B 11/00; G01N 21/885; G01N 21/956; G03F 7/7065; G03F 1/84; G06T 7/0004; G06T 7/0006
See application file for complete search history.

(56) References Cited

U.S. PATENT DOCUMENTS

| | | | |
|---|---|---|---|
| 5,608,526 A | 3/1997 | Piwonka-Corle et al. |
| 5,859,424 A | 1/1999 | Norton et al. |
| 6,429,943 B1 | 8/2002 | Opsal et al. |
| 6,633,831 B2 | 10/2003 | Nikoonahad et al. |
| 6,734,967 B1 | 5/2004 | Piwonka-Corle et al. |

(Continued)

OTHER PUBLICATIONS

International Search Report dated Jul. 28, 2016, for PCT Application No. PCT/US2016/031381 filed May 7, 2016 by KLA-Tencor Corporation, 3 pages.

*Primary Examiner* — Sang Nguyen
(74) *Attorney, Agent, or Firm* — Spano Law Group; Joseph S. Spano

(57) ABSTRACT

Methods and systems for monitoring parameters characterizing a set of hot spot structures fabricated at different locations on a semiconductor wafer are presented herein. The hot spot structures are device structures that exhibit sensitivity to process variations and give rise to limitations on permissible process variations that must be enforced to prevent device failures and low yield. A trained hot spot measurement model is employed to receive measurement data generated by one or more metrology systems at one or more metrology targets and directly determine values of one or more hot spot parameters. The hot spot measurement model is trained to establish a functional relationship between one or more characteristics of a hot spot structure under consideration and corresponding measurement data associated with measurements of at least one metrology target on the same wafer. A fabrication process parameter is adjusted based on the value of a measured hot spot parameter.

20 Claims, 5 Drawing Sheets

(56) References Cited

U.S. PATENT DOCUMENTS

| | | | |
|---|---|---|---|
| 6,816,570 | B2 | 10/2004 | Janik et al. |
| 6,895,075 | B2 | 5/2005 | Yokhin et al. |
| 6,972,852 | B2 | 12/2005 | Opsal et al. |
| 7,478,019 | B2 | 1/2009 | Zangooie et al. |
| 7,826,071 | B2 | 11/2010 | Shchegrov et al. |
| 7,929,667 | B1 | 4/2011 | Zhuang et al. |
| 7,933,026 | B2 | 4/2011 | Opsal et al. |
| 8,434,030 | B1 | 4/2013 | Hou et al. |
| 2005/0008218 | A1 | 1/2005 | O'Dell et al. |
| 2008/0163140 | A1* | 7/2008 | Fouquet ............... G03F 7/7065 700/110 |
| 2008/0167829 | A1* | 7/2008 | Park .................. G01N 21/8851 702/81 |
| 2009/0185739 | A1* | 7/2009 | Amini .................. G06K 9/6293 382/144 |
| 2011/0251713 | A1 | 10/2011 | Teshima et al. |
| 2011/0276935 | A1* | 11/2011 | Fouquet ............... G06T 7/0006 716/112 |
| 2013/0077742 | A1 | 3/2013 | Schueler et al. |
| 2013/0304424 | A1 | 11/2013 | Bakeman et al. |
| 2014/0019097 | A1 | 1/2014 | Bakeman et al. |
| 2014/0111791 | A1 | 4/2014 | Manassen et al. |
| 2014/0172394 | A1 | 6/2014 | Kuznetsov et al. |
| 2014/0222380 | A1 | 8/2014 | Kuznetsov et al. |
| 2014/0241610 | A1 | 8/2014 | Duffy et al. |
| 2014/0297211 | A1 | 10/2014 | Pandev et al. |
| 2014/0316730 | A1 | 10/2014 | Shchegrov et al. |
| 2015/0012900 | A1* | 1/2015 | Shifrin ............... G01N 21/9501 716/112 |
| 2015/0046118 | A1 | 2/2015 | Pandev et al. |
| 2015/0054940 | A1* | 2/2015 | Shi .......................... G06T 7/001 348/87 |
| 2015/0120220 | A1 | 4/2015 | Wu et al. |

* cited by examiner

MODEL-BASED HOT SPOT MONITORING

CROSS REFERENCE TO RELATED APPLICATION

The present application for patent claims priority under 35 U.S.C. § 119 from U.S. provisional patent application Ser. No. 62/158,618, entitled "Model-Based Hot Spot Monitoring," filed May 8, 2015, the subject matter of which is incorporated herein by reference in its entirety.

TECHNICAL FIELD

The described embodiments relate to metrology systems and methods, and more particularly to methods and systems for improved measurement of semiconductor structures.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

The geometry of structures fabricated on a semiconductor wafer depends on process conditions during lithographic exposure. Process parameters such as focus, dose, and scanner aberration affect the shape of the resulting structures differently, depending on the type of structure being fabricated. For example, relatively isolated structures are more sensitive to focus changes, while relatively dense structures are more sensitive to changes in dosage. Device functionality and manufacturing yield is limited by the quality of the structures formed by patterning steps, e.g., lithography, deposition, etch, etc.

Metrology processes are used at various steps during a semiconductor manufacturing process to detect defects on wafers to promote higher yield. Optical metrology techniques offer the potential for high throughput without the risk of sample destruction. A number of optical metrology based techniques including scatterometry and reflectometry implementations and associated analysis algorithms are commonly used to characterize critical dimensions, film thicknesses, composition, overlay and other parameters of nanoscale structures.

Existing model based metrology methods typically include a series of steps to model and then measure structure parameters. Typically, measurement data is collected (e.g., DOE spectra) from a particular metrology target. An accurate model of the optical system, dispersion parameters, and geometric features is formulated. Film spectra measurements are collected to determine material dispersions. A parametric geometric model of the target structure is created along with an optical model. In addition, simulation approximations (e.g., slabbing, Rigorous Coupled Wave Analysis (RCWA), etc.) must be carefully performed to avoid introducing excessively large errors. Discretization and RCWA parameters are defined. A series of simulations, analysis, and regressions are performed to refine the geometric model and determine which model parameters to float. A library of synthetic spectra is generated. Finally, measurements are performed using the library and the geometric model. Each step introduces errors and consumes a significant amount of computational and user time. Typically, a model building task requires days, or even weeks, to complete. In addition, the size of the library and the computation time associated with performing regression calculations during measurement reduces the throughput of the measurement system.

In addition, conventional metrology techniques rely on dedicated metrology structures or targets. In semiconductor manufacture, and patterning processes in particular, process control is enabled by performing metrology on specific dedicated structures. These dedicated structures may be located in the scribe lines between dies, or within the die itself. The use of dedicated metrology structures may introduce significant measurement errors.

Discrepancies between actual device structures and dedicated metrology targets limit the ability of metrology data to accurately reflect the status of the actual device features in the die. In one example, discrepancies arise due to location dependent differences in process loading, pattern density, or aberration fields because the dedicated metrology targets and actual device structures are not collocated. In another example, the characteristic feature sizes of the dedicated metrology structures and the actual device structure are often quite different. Hence, even if the dedicated metrology target and the actual device structure are in close proximity, discrepancies result from differences in size.

In some examples, CD-SEM is used for hot spot monitoring, but CD-SEM suffers from low throughput and insufficient precision that makes it unsuitable for inline, high throughput metrology. In addition, CD-SEM frequently deforms the pattern undergoing measurement, and thus is not suitable for measuring device structures.

Future metrology applications present challenges due to increasingly small resolution requirements and increasingly complex geometric structures. Methods and systems for improved monitoring of the geometry of a large number of different types of structures during fabrication are desired to identify defects early in the manufacturing process.

SUMMARY

Methods and systems for monitoring parameters characterizing a set of hot spot structures fabricated at different locations on a semiconductor wafer are presented herein. The hot spot structures are device structures that exhibit sensitivity to process variations and give rise to limitations on permissible process variations that must be enforced to prevent device failures and low yield. The value of a parameter characterizing a hot spot structure is estimated based on measurement data collected from metrology targets fabricated on the same wafer as the set of hot spot structures and a trained hot spot measurement model.

In one aspect, a trained hot spot measurement model is employed as the measurement model for hot spot structures having unknown parameter values. The hot spot measurement model is structured to receive measurement data (e.g., measured spectra) generated by one or more metrology systems at one or more metrology targets, and directly determine one or more parameters of interest of hot spot device structures. In this manner, each structure being characterized by the measurement (i.e., each hot spot structure) is different from the one or more metrology targets undergoing measurement by the high-throughput metrology technique. Examples of parameters characterizing the hot spot structure include, but are not limited to, critical dimension (CD), height, sidewall angle, overlay, etc. In general, a hot spot structure may be characterized in any suitable manner including image characteristics, various geometric features, patterns, etc.

High throughput, inline metrology techniques (e.g., optical scatterometry, imaging, or other techniques) are employed to measure metrology targets located on the wafer under measurement. The high throughput, inline metrology techniques typically lack measurement sensitivity to the parameters characterizing the set of hot spot structures, but have sufficient sensitivity to process induced changes in the structures of the metrology targets. In this manner, a trained hot spot measurement model that relates measurement data collected from nearby metrology targets by a high-throughput metrology technique to parameters of interest of a hot spot structure is employed to provide inline metrology of parameters of interest that otherwise would not be measurable.

In another aspect, the hot spot measurement model is trained to establish a functional relationship between one or more characteristics of a hot spot structure under consideration and corresponding measurement data associated with measurements of at least one metrology target on the same wafer. By using raw measurement data (i.e., measurement data generated directly by the measurement system) to create the measurement model, as described herein, the errors and approximations associated with traditional model based metrology methods are reduced. In addition, the measurement model is not sensitive to systematic errors, asymmetries, etc., because the measurement model is trained based on measurement data collected, or simulated, from a particular metrology system and used to perform measurements based on measurement data collected from the same metrology system.

The trained hot spot measurement models described herein receive measurement data directly as input and provide values of parameters of interest as output. By streamlining the measurement process, the predictive results are improved along with a reduction in computation and user time. In some examples, the hot spot measurement model can be created in less than an hour. In addition, by employing a simplified model, measurement time is reduced compared to existing metrology methods.

The training of the hot spot measurement model is performed under a controlled DOE (design of experiments) variation of process parameters (e.g., lithography focus, exposure, aberration parameters, overlay offset, etch time, temperature, pressure, and other local or global parameters).

In a further aspect, the same measurement signals from the same metrology targets can be used to create different hot spot measurement models for measuring other hot spot parameters of interest. The hot spot measurement model is trained based on measurement data simulated or measured from the metrology targets and simulated or measured hot spot parameters that include the range of process variations as described herein. With a hot spot measurement model trained for each hot spot parameter of interest, measurements of one or more metrology targets provide input to the hot spot measurement models to determine values of each parameter of interest.

In another further aspect, signals from multiple targets each measured by multiple metrology techniques increases the information content in the set of signals employed to train and use the hot spot measurement model. Diversity of metrology targets and metrology techniques reduces the correlation to process or other parameter variations.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for monitoring parameters characterizing a set of hot spot structures fabricated at different locations on a semiconductor wafer are presented herein. The hot spot structures are device structures that exhibit sensitivity to process variations and give rise to limitations on permissible process variations that must be enforced to prevent device failures and low yield. The value of a parameter characterizing a hot spot structure is estimated based on measurement data collected from metrology targets fabricated on the same wafer as the set of hot spot structures and a trained hot spot measurement model.

High throughput, inline metrology techniques (e.g., optical scatterometry, imaging, or other techniques) are employed to measure metrology targets located on the wafer under measurement. The high throughput, inline metrology techniques typically lack measurement sensitivity to the parameters characterizing the set of hot spot structures, but have sufficient sensitivity to process induced changes in the structures of the metrology targets. In this manner, a trained hot spot measurement model that relates measurement data collected from nearby metrology targets by a high-throughput metrology technique to parameters of interest of a hot spot structure is employed to provide inline metrology of parameters of interest.

Figure 1:
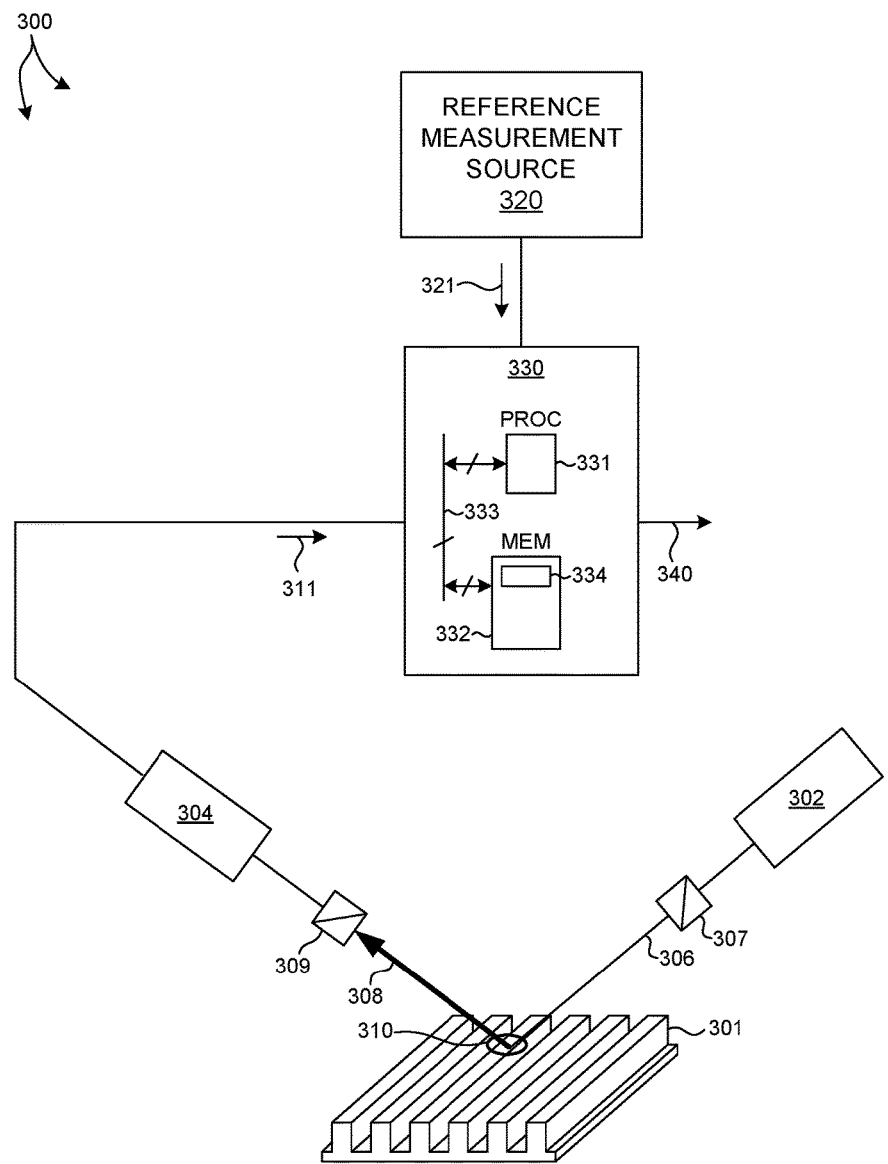
FIG. 1 depicts a metrology system 300 suitable for implementation of method 110 depicted in FIG. 2 and method 100 depicted in FIG. 3.

FIG. 1 illustrates a system 300 for measuring characteristics of a specimen in accordance with the exemplary methods presented herein. As shown in FIG. 1, the system 300 may be used to perform spectroscopic ellipsometry measurements of one or more structures of a specimen 301. In this aspect, the system 300 may include a spectroscopic ellipsometer equipped with an illuminator 302 and a spectrometer 304. The illuminator 302 of the system 300 is configured to generate and direct illumination of a selected wavelength range (e.g., 100-2500 nm) to the structures disposed on the surface of the specimen 301. In turn, the spectrometer 304 is configured to collect radiation from the surface of the specimen 301 in response to the illumination provided by illuminator 302. It is further noted that the light emerging from the illuminator 302 is polarized using a polarization state generator 307 to produce a polarized illumination beam 306. The radiation collected from the structure disposed on the specimen 301 is passed through a polarization state analyzer 309 and to the spectrometer 304. The radiation received by the spectrometer 304 in the collection beam 308 is analyzed with regard to polarization state, allowing for spectral analysis by the spectrometer of radiation passed by the analyzer. These spectra 311 are passed to computing system 330 for analysis of the structure.

As depicted in FIG. 1, system 300 includes a single measurement technology (i.e., SE). However, in general, system 300 may include any number of different measurement technologies. By way of non-limiting example, system 300 may be configured as a spectroscopic ellipsometer (including Mueller matrix ellipsometry), a spectroscopic reflectometer, a spectroscopic scatterometer, an overlay scatterometer, an angular resolved beam profile reflectometer, a polarization resolved beam profile reflectometer, a beam profile reflectometer, a beam profile ellipsometer, any single or multiple wavelength ellipsometer, or any combination thereof. Furthermore, in general, measurement data collected by different measurement technologies and analyzed in accordance with the methods described herein may be collected from multiple tools, rather than one tool integrating multiple technologies.

In a further embodiment, system 300 may include one or more computing systems 330 employed to perform measurements of actual device structures based on measurement models developed in accordance with the methods described herein. The one or more computing systems 330 may be communicatively coupled to the spectrometer 304. In one aspect, the one or more computing systems 330 are configured to receive measurement data 311 associated with measurements of the structure of specimen 301.

It should be recognized that the various steps described throughout the present disclosure may be carried out by a single computer system 330 or, alternatively, a multiple computer system 330. Moreover, different subsystems of the system 300, such as the spectroscopic ellipsometer 304, may include a computer system suitable for carrying out at least a portion of the steps described herein. Therefore, the aforementioned description should not be interpreted as a limitation on the present invention but merely an illustration. Further, the one or more computing systems 330 may be configured to perform any other step(s) of any of the method embodiments described herein.

In addition, the computer system 330 may be communicatively coupled to the spectrometer 304 in any manner known in the art. For example, the one or more computing systems 330 may be coupled to computing systems associated with the spectrometer 304. In another example, the spectrometer 304 may be controlled directly by a single computer system coupled to computer system 330.

The computer system 330 of the metrology system 300 may be configured to receive and/or acquire data or information from the subsystems of the system (e.g., spectrometer 304 and the like) by a transmission medium that may include wireline and/or wireless portions. In this manner, the transmission medium may serve as a data link between the computer system 330 and other subsystems of the system 300.

Computer system 330 of metrology system 300 may be configured to receive and/or acquire data or information (e.g., measurement results, modeling inputs, modeling results, reference measurement results, etc.) from other systems by a transmission medium that may include wireline and/or wireless portions. In this manner, the transmission medium may serve as a data link between the computer system 330 and other systems (e.g., memory on-board metrology system 300, external memory, reference measurement source 320, or other external systems). For example, the computing system 330 may be configured to receive measurement data from a storage medium (i.e., memory 332 or an external memory) via a data link. For instance, spectral results obtained using spectrometer 304 may be stored in a permanent or semi-permanent memory device (e.g., memory 332 or an external memory). In this regard, the spectral results may be imported from on-board memory or from an external memory system. In another example, the computing system 330 may be configured to receive reference measurement data 321 from a reference measurement source (e.g., a storage medium) via a data link. For instance, reference measurement results obtained using a reference measurement system may be stored in a permanent or semi-permanent memory device. In this regard, the reference measurement results may be imported from on-board memory or from an external memory system. Moreover, the computer system 330 may send data to other systems via a transmission medium. For instance, a measurement model or a hot spot parameter value 340 determined by computer system 330 may be communicated and stored in an external memory. In another example, a hot spot parameter value 340 determined by computer system 330 may be communicated to a process tool that causes the process tool to adjust a process parameter associated with a fabrication process step of a semiconductor wafer fabrication sequence based on the value of the at least one parameter characterizing the hot spot structure. In this regard, measurement results may be exported to another system.

Computing system 330 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 334 implementing methods such as those described herein may be transmitted over a transmission medium such as a wire, cable, or wireless transmission link. For example, as illustrated in FIG. 1, program instructions 334 stored in memory 332 are transmitted to processor 331 over bus 333. Program instructions 334 are stored in a computer readable medium (e.g., memory 332). Exemplary computer-readable media include read-only memory, a random access memory, a magnetic or optical disk, or a magnetic tape.

In some examples, the model building, training, and measurement methods described herein are implemented as an element of a SpectraShape® optical critical-dimension metrology system available from KLA-Tencor Corporation, Milpitas, Calif., USA. In this manner, the model is created and trained by the system.

In some other examples, the model building and training methods described herein are implemented off-line, for example, by a computing system implementing AcuShape® software available from KLA-Tencor Corporation, Milpitas, Calif., USA. The resulting, trained model may be incorporated as an element of an AcuShape® library that is accessible by a metrology system performing measurements.

In one aspect, a trained hot spot measurement model is employed as the measurement model for hot spot structures having unknown parameter values. The hot spot measurement model is structured to receive measurement data (e.g., measured spectra) generated by one or more metrology systems at one or more metrology targets, and directly determine one or more parameters of interest of hot spot device structures. Examples of parameters characterizing the hot spot structure include, but are not limited to, critical dimension (CD), height, sidewall angle, overlay, etc. In general, a hot spot structure may be characterized in any suitable manner including image characteristics, various geometric features or patterns, etc. In one example, after a lithographic step, a hot spot is a location where two adjacent photoresist patterns touch each other where they should be separated by some critical dimension. This type of hot spot is often referred to a "bridging." In another example, after a lithographic step, a hot spot is a location where a metal wire is thinned excessively, or shorted.

Figure 2:
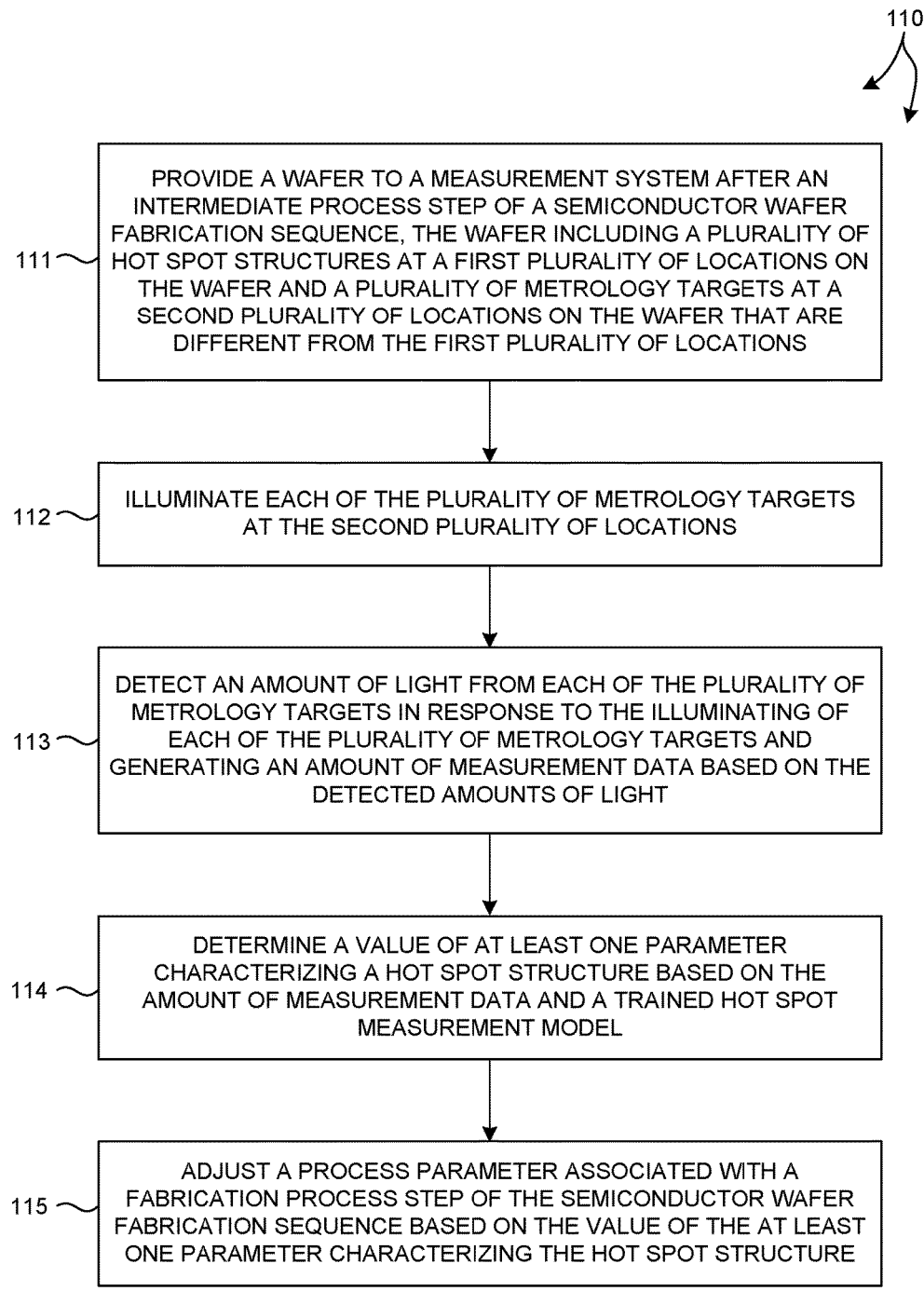
FIG. 2 illustrates a method 110 of measuring hot spot structures based on measurements of nearby metrology targets based on a trained hot spot measurement model.

FIG. 2 illustrates a method 110 suitable for implementation by a metrology system such as metrology system 300 illustrated in FIG. 1 of the present invention. In one aspect, it is recognized that data processing blocks of method 110 may be carried out via a pre-programmed algorithm executed by one or more processors of computing system 330, or any other general purpose computing system. It is recognized herein that the particular structural aspects of metrology system 300 do not represent limitations and should be interpreted as illustrative only.

In block 111, a wafer is provided to a measurement system after an intermediate process step of a semiconductor wafer fabrication sequence. The wafer includes a plurality of hot spot structures at a first plurality of locations on the wafer. The wafer also includes a plurality of metrology targets at a second plurality of locations on the wafer that are different from the first plurality of locations.

In an optional block (not shown), principal features from at least a portion of the measured data are determined based on a mathematical transformation that reduces the dimension of the measured data. In some embodiments, the transformation is the same transformation employed to reduce the dimension of corresponding training data employed to train the hot spot measurement model.

In block 112, each of the plurality of metrology targets at the second plurality of locations is illuminated by an illuminator of a metrology system (e.g., illuminator 302). In general, the metrology system, or combination of metrology systems employed to measure the metrology targets employs the same metrology technique, or combination of metrology techniques employed to train the hot spot measurement model. Similarly, the metrology targets measured by the metrology system, or combination of metrology systems are the same types of structures as the metrology targets employed to train the hot spot measurement model.

In block 113, an amount of light is detected from each of the plurality of metrology targets (e.g., by spectrometer 304) in response to the illumination provided to each of the plurality of metrology targets. In addition, an amount of measurement data (e.g., measurement data 311) is generated (e.g., by spectrometer 304) based on the detected amounts of light. The amount of measurement data associated with measurements of the metrology targets is received by a computing system (e.g., computing system 330).

In block 114, the value of one or more parameters characterizing a hot spot structure is determined based on the measurement data and a trained hot spot measurement model (e.g., the trained hot spot measurement model described with reference to method 100). When a mathematical transformation is employed to reduce the dimension of the measured data, the value of one or more parameter values characterizing the hot spot structure is determined based on the principal features and the trained hot spot measurement model. In this manner, hot spot parameter values are determined based on the trained hot spot measurement model and the reduced set of measurement signals.

Figure 4:
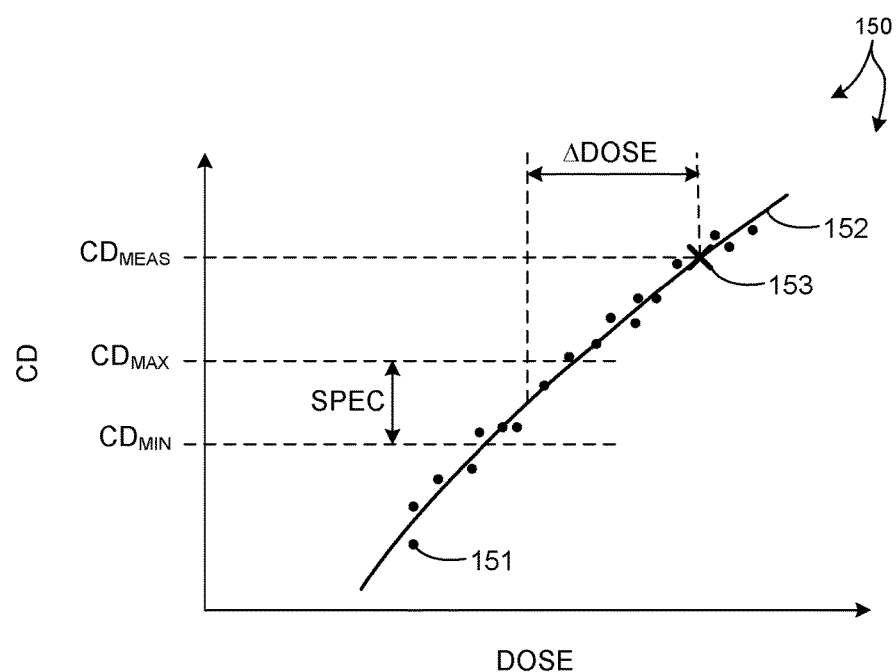
FIG. 4 depicts a diagram 150 illustrative of exemplary data points 151 that represent values of CD for each dosage represented in a DOE training set.

In block 115, a process parameter associated with a fabrication process step of the semiconductor wafer fabrication sequence is adjusted based on the value of the at least one parameter characterizing the hot spot structure. The hot spot measurement model is trained for all measured signals in the process variation space defined by a Design of Experiments (DOE) set. Thus, a mapping is determined between the process variables within the DOE process variation space and the resulting hot spot parameter values. FIG. 4 depicts an illustrative diagram 150 including exemplary data points 151 that represent values of CD, either measured by a reference measurement system, or simulated, for each dosage represented in the DOE training set. A functional relationship between CD and dosage is established, for example, by fitting a curve 152 to data points 151.

In block 115, a correction to one or more process parameters is determined based on a measured value of a hot spot parameter and the mapping between the hot spot parameter value (e.g., CD) and the one or more process parameters. For example, point 153 illustrated in FIG. 4 represents a measured value of CD associated with a hot spot structure determined by a trained measurement model as described hereinbefore. It is desired to correct the process dosage such that a subsequent measured value of CD will be within the specification range between $CD_{max}$ and $CD_{min}$. Based on the functional mapping between CD and dosage, a dosage correction, $\Delta DOSE$, is determined that should result in a measured value of CD that lands in the middle of the specification range.

The example illustrated in FIG. 4 is presented for illustrative purposes. In general, a multi-dimensional response surface can be created that relates the DOE process variables to the hot spot parameters of interest. Corrections to one or more process parameters can be calculated to drive measured values of hot spot parameters of interest within specification based on the multi-dimensional response surface.

The determined hot spot parameter values are stored in a memory. For example, the device parameter values may be stored on-board the measurement system 300, for example, in memory 332, or may be communicated (e.g., via output signal 340) to an external memory device, for example, an external memory device of a process tool.

In another aspect, the hot spot measurement model is trained to establish a functional relationship between one or more characteristics of a hot spot structure under consideration and corresponding measurement data associated with measurements of at least one metrology target on the same wafer. In this manner, each structure being characterized by the measurement (i.e., each hot spot structure) is different from the one or more metrology targets undergoing measurement by the high-throughput metrology technique. In some examples, at least one of the metrology targets is a device structure (e.g., line-space grating, FinFET structure, SRAM device structure, Flash device structure, DRAM device structure, etc.). In some examples, one or more of the metrology targets are the same type of structure as the hot spot structure under measurement.

By using raw measurement data (i.e., measurement data generated directly by the measurement system) to create the measurement model, as described herein, the errors and approximations associated with traditional model based metrology methods are reduced. In addition, the measurement model is not sensitive to systematic errors, asymmetries, etc. because the measurement model is trained based on measurement data collected, or simulated, from a particular metrology system and used to perform measurements based on measurement data collected from the same metrology system.

The trained hot spot measurement models described herein receive measurement data directly as input and provide values of parameters of interest as output. By streamlining the measurement process, the predictive results are improved along with a reduction in computation and user time. In some examples, the hot spot measurement model can be created in less than an hour. In addition, by employing a simplified model, measurement time is reduced compared to existing metrology methods.

The training of the hot spot measurement model is performed under a controlled DOE (design of experiments) variation of process parameters (e.g., lithography focus, exposure, aberration parameters, overlay offset, etch time, temperature, pressure, and other local or global parameters). After training is complete, inline optical metrology can operate in a stand-alone or integrated mode.

Figure 3:
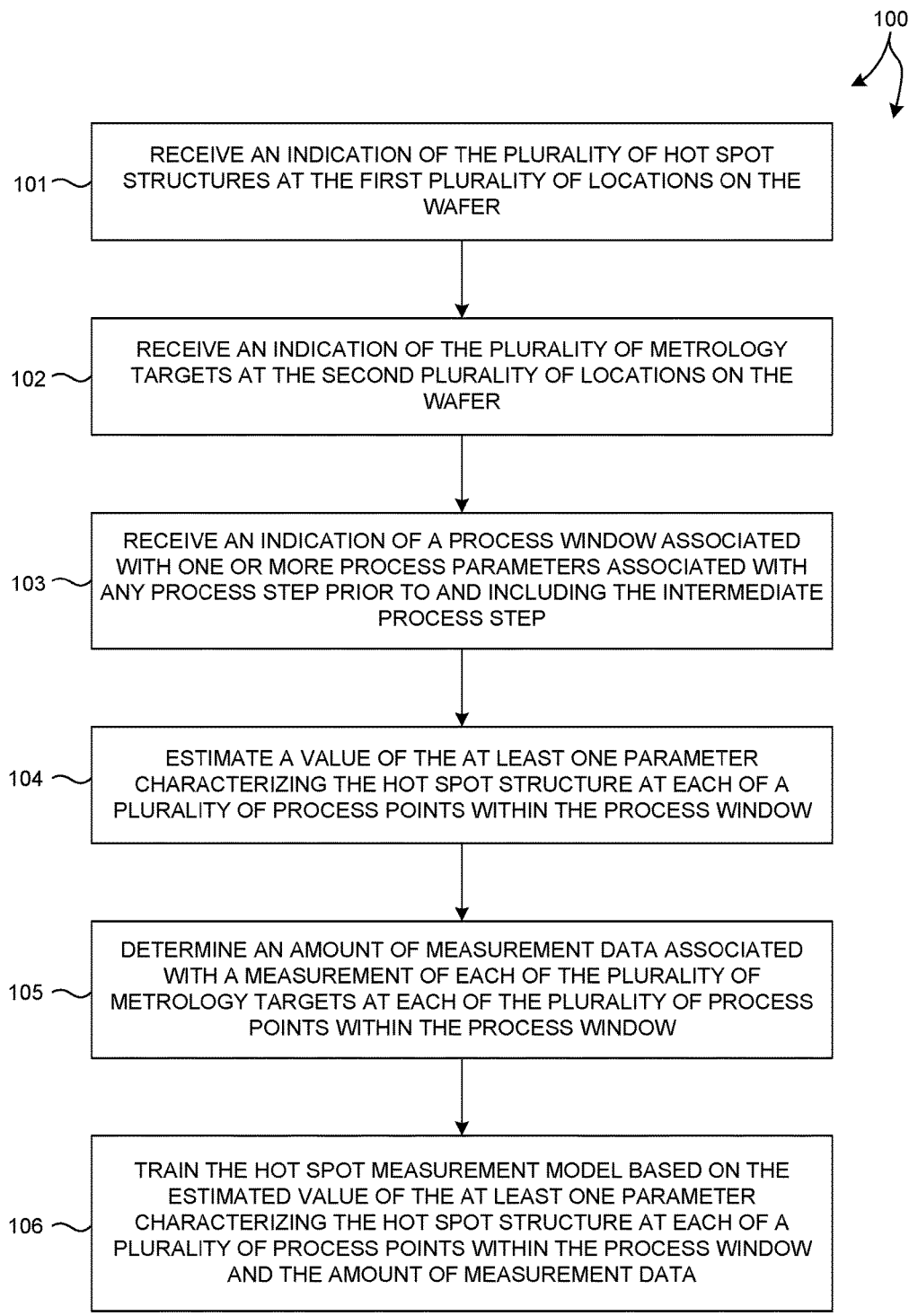
FIG. 3 illustrates a method 100 of training a hot spot measurement model suitable for measuring hot spot structures based on measurements of nearby metrology targets.

FIG. 3 illustrates a method 100 of training a hot spot measurement model for hot spot monitoring in at least one novel aspect. Method 100 is suitable for implementation by a metrology system such as metrology system 300 illustrated in FIG. 1 of the present invention. In one aspect, it is recognized that data processing blocks of method 100 may be carried out via a pre-programmed algorithm executed by one or more processors of computing system 330, or any other general purpose computing system. It is recognized herein that the particular structural aspects of metrology system 300 do not represent limitations and should be interpreted as illustrative only. The training is performed in the recipe development phase of the manufacturing process. Training of the hot spot measurement model is not performed for every production wafer.

In block 101, an indication of a set of hot spot structures to be fabricated at different locations on a wafer is received by a computing system (e.g., computing system 330). In some embodiments, the set of hot spot structures is defined by a user based on experience, prior measurements, etc. The set of hot spot structures are parameterized by the user in any suitable manner. Thus, in this example, the set of hot spot structures and their parameterization is communicated to computing system 330 by user input.

In block 102, an indication of a set of metrology targets to be fabricated on the wafer at locations different from the locations where the hot spot structures are to be fabricated is received by a computing system (e.g., computing system 330). In some embodiments, the set of metrology targets and their parameterization is defined by a user, and the set of parameterized metrology targets is communicated to computing system 330 by user input.

In block 103, an indication of a process window associated with one or more process parameters associated with any process step prior to and including the intermediate process step is received by a computing system (e.g., computing system 330). In one example, the set of process conditions describes different points in a space of lithography focus and dosage settings.

In block 104, a value of the at least one parameter characterizing the hot spot structure is estimated at each of a plurality of process points within the process window. In some embodiments, computing system 330 determines the expected hot spot parameter values associated with each process point within the process window at each measurement site based on a simulation. For example, a process simulator is employed to define the expected response of a hot spot parameter (i.e., a geometric or material parameter) for a given set of process parameter values. An exemplary process simulator includes the Positive Resist Optical Lithography (PROLITH) simulation software available from KLA-Tencor Corporation, Milpitas, Calif. (USA). In general, any process modeling technique or tool may be contemplated within the scope of this patent document (e.g., Coventor simulation software available from Coventor, Inc., Cary, N.C., USA).

In some other embodiments, the expected hot spot parameter values associated with each process point within the process window at each measurement site is based on actual measurements (e.g., reference measurements 321) of one or more DOE wafers by a reference metrology system (e.g., reference measurement source 320). The measurement sites probed by the reference metrology system include hot spot structures having one or more parameters of interest that are measured by the reference metrology system. In general, the reference measurements may be performed by one or more reference metrology systems. By way of non-limiting example, a Critical Dimension Scanning Electron Microscope (CD-SEM), a Critical Dimension Small Angle X-Ray Scatterometer (CD-SAXS), an Atomic Force Microscope (AFM), etc. may be employed alone, or in combination, to perform reference measurements of a hot spot structure. These measurement techniques are unable to be used for inline metrology due to low throughput, high measurement uncertainty for each individual site, risk of sample destruction, etc. The measurement by a reference metrology system may be performed either on device structures or on device-like structures located, e.g. in the scribeline area, to make them more suitable for reference metrology measurement.

In block 105, an amount of measurement data associated with a measurement of each of the plurality of metrology targets is determined at each of the plurality of process points within the process window. In some embodiments, computing system 330 determines expected metrology target parameter values associated with each process point within the process window at each measurement site based on a simulation. For example, a process simulator is employed to define the expected response of a metrology target parameter (i.e., a geometric or material parameter) for a given set of process parameter values. In addition, computing system 330 employs a measurement simulator (e.g., RCWA, etc.) to simulate the raw measurement data generated by the measurement system (e.g., the spectroscopic ellipsometer depicted in FIG. 1) for each metrology target.

In some other embodiments, the measurement data associated with measurements of each metrology target at each process point within the process window is based on actual measurements (e.g., measurements 311) of one or more DOE wafers by the metrology target measurement system (e.g., the spectroscopic ellipsometer depicted in FIG. 1). The measurement sites probed by the metrology target measurement system include metrology targets having one or more parameters of interest that are measured by the metrology target measurement system.

In some of the aforementioned embodiments, either, or both, the reference hot spot measurements and the measurements of the metrology targets are actual measurements performed on one or more DOE wafers. In these embodiments, variations of one or more process parameters, structural parameters, or both, are organized in a DOE pattern on the surface of one or more semiconductor wafers for training purposes. In this manner, the reference and metrology target measurement systems interrogate different locations on the wafer surface that correspond to different values of one or more process parameters, structural parameters, or both.

In some examples, a DOE set of metrology targets and corresponding hot spot structures is produced on a single wafer. For example, the DOE set of metrology targets and hot spot structures may be generated by varying any one or combination of etch settings, lithography focus, dose, aberration, and overlay settings as a function of location on the surface of a single wafer. In some examples, a DOE set of metrology targets and corresponding hot spot structures is produced on several wafers. For example, the impact of variations in process parameters that affect the entire wafer such as deposition time, etch time, wafer level lithography focus, etc. can be explored with a set of multiple DOE wafers. In this manner, the impact on measured metrology signals and hot spot parameters of interest from variations in process parameters is explored.

The training targets may be provided on a separate training wafer or on a production wafer. In some examples, the metrology targets are located in a scribeline of a production wafer. In some other examples, the metrology targets are located in the active die area.

In some examples, a special mask or set of masks including DOE variations is designed to produce training wafers. In some other examples, training targets can be located within production masks. In some other examples, DOE variations are entirely controlled by the process control settings without special masks or mask features.

Figure 5:
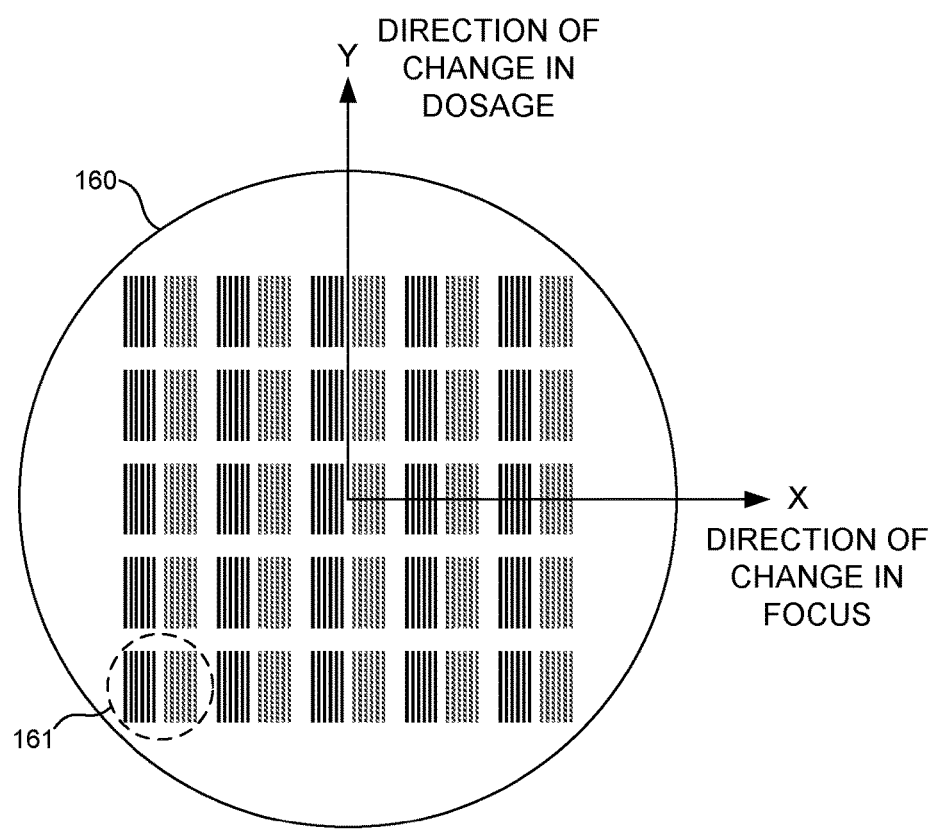
FIG. 5 illustrates a DOE wafer 160 having a grid of targets that exhibit known variations in lithography focus and dosage in one embodiment.

In one example, the DOE pattern is a lithography focus/dosage pattern. Typically, a DOE wafer exhibiting an focus/dosage pattern includes a grid pattern of measurement sites. In one grid direction (e.g., the x-direction), the focus is varied in the x-direction while the focus in the y-direction is held constant. In the orthogonal grid direction (e.g., the y-direction), the dosage error is varied while the dosage in the x-direction is held constant. In this manner, measurement data collected from the DOE wafer includes data associated with variations in lithography focus and dosage settings in the x and y directions, respectively. FIG. 5 depicts a DOE wafer 160 having a grid of targets (e.g., target 161) that exhibit sensitivity to variations in focus and dosage. The focus varies as a function of location in the x-direction on the DOE wafer 160. The dosage varies as a function of location on the DOE wafer 160 in the y-direction.

In general, the metrology targets are designed for printability and sensitivity to changes in process parameters, structural parameters of interest, or both. In some examples, the metrology targets are specialized targets that are not the same type as the corresponding hot spot structure. In some embodiments, the metrology targets are based on conventional line/space targets. By way of non-limiting example, CD targets, SCOL targets, or AiM targets may be employed. In some other embodiments, the metrology targets are device-like structures that are the same type as the hot spot structure. In some other examples, the metrology targets are device structures, or portions of device structures. Regardless of the type of metrology target employed, a set of training targets that exhibit sensitivity to the process variations, structural variations, or both, being explored must be provided to train the hot spot measurement model. Once the model is trained, it may be used to perform measurements of hot spot structures having unknown values of one or more parameters of interest as described herein.

Optionally, a number of principal features are extracted from the measurement data based on a mathematical transformation. The transformation reduces the dimension of the optical measurement data and maps the original signals to a new reduced set of signals. Each measured signal is treated as an original signal that changes within the process range for different measurements in the set of optical measurement data. The transformation may be applied to all of measurement signals, or a subset of measurement signals. In some examples, the signals subject to analysis are chosen randomly. In some other examples, the signals subject to analysis are chosen due to their relatively high sensitivity to changes in process parameters. For example, signals that are not sensitive to changes in process parameters may be ignored.

By way of non-limiting example, the transformation may be achieved using any of a principal component analysis (PCA) model, a kernel PCA model, a non-linear PCA model, an independent component analysis (ICA) model or other dimensionality reduction methods using dictionaries, a discrete cosine transform (DCT) model, fast fourier transform (FFT) model, a wavelet model, etc.

In block 106, the hot spot measurement model is trained based on the estimated value of the at least one parameter characterizing the hot spot structure at each of a plurality of process points within the process window and the amount of measurement data. If an optional data reduction step is performed, the hot spot measurement model is trained based on the principal features extracted from the measurement data. In some embodiments, the measurement model is implemented as a neural network model. In one example, the number of nodes of the neural network is selected based on the features extracted from the training data. In other examples, the measurement model may be implemented as a linear model, a non-linear model, a polynomial model, a response surface model, a random forest model, a support vector machines model, or other types of models. In some examples, the measurement model may be implemented as a combination of models. The model is trained such that its output fits the reference hot spot parameter values for all the measured signals in the process variation space defined by the set of DOE metrology targets and corresponding hot spot structures.

In this manner, the trained measurement model maps the metrology signals measured with the metrology target measurement tool(s) to the values of the hot spot parameters of interest, either simulated or measured.

In a further aspect, a mapping is determined between the process variables within the DOE process variation space and the values of the hot spot parameters of interest. Since the model is trained for all measured signals in the process variation space defined by the DOE set, the trained measurement model can be augmented to also map the process conditions to the hot spot parameters of interest. In this manner, the trained hot spot measurement model is employed to measure process parameters of interest (e.g., focus/dose, exposure, etc.), in addition to one or more hot spot parameters of interest (e.g., EPE, overlay, CD, pitch walk, etc.) from the same metrology targets.

In some embodiments, the metrology targets are design rule targets. In other words, the metrology targets adhere to the design rules applicable to the underlying semiconductor manufacturing process. In some examples, the metrology targets are preferably located within the active die area. In some examples, the metrology targets have dimensions of 15 µm by 15 µm, or smaller. In this manner, the impact on overlay of intra-field variations induced by lithographic imperfections can be analyzed. In some other examples, the metrology targets are located in the scribe lines, or otherwise outside the active die area.

In general, the metrology target to be measured is spatially separated from the hot spot structure to be characterized. However, in preferred embodiments, the metrology target is located close to the hot spot structure of interest. The metrology target is selected to produce measurement signals with high sensitivity to parameters of interest. However, the training or mapping is performed to actual device structures simulated or measured with reference tools such as CD-SEM, CD/OVL-SAXS, AFM, or model-based optical CD. After model training, production wafers can be measured inline and measurement data collected from metrology targets. The measurement data is mapped to hot spot parameters of interest by the trained hot spot measurement model.

In some other embodiments, the metrology targets are separated from the hot spot structure of interest by time (i.e., separated by one or more process steps). In these examples, the training sequence can use the same or different types of targets that are separated by one or more processing steps from the hot spot structure to be measured. In some examples, the metrology targets are structures in a particular process state. Measurement data collected from hot spot structures in a particular process state are used to train the hot spot measurement model as described herein. The trained hot spot measurement model is then used to calculate values of structural parameters, process parameters, or both, of hot spot structures in a subsequent process state based on measurement data collected from metrology targets at the same particular process state used to train the hot spot measurement model.

In a further aspect, the same measurement signals from the same metrology targets can be used to create different hot spot measurement models for measuring other hot spot parameters of interest. In general, the aforementioned measurement techniques may be applied to the measurement of other process, structure, dispersion parameters, or any combination of these parameters. By way of non-limiting example, overlay, profile geometry parameters (e.g., critical dimension), process parameters (e.g., focus, and dose), dispersion parameters, pitch walk, edge placement errors, or any combination of parameters may be measured using the aforementioned techniques. A set of training targets with variations of each parameter of interest must be provided. The hot spot measurement model is then trained based on measurement data simulated or measured from the metrology targets and simulated or measured hot spot parameters that include the range of process variations as described herein. With a hot spot measurement model trained for each hot spot parameter of interest, measurements of one or more metrology targets provide input to the hot spot measurement models to determine values of each parameter of interest.

In another further aspect, the methods and systems for training the measurement model include an optimization algorithm to automate any or all of the elements required to arrive at a trained measurement model.

In some examples, an optimization algorithm is configured to maximize the performance of the measurement (defined by a cost function) by optimizing any or all of the following parameters: the type of feature extraction model (i.e., transformation), the parameters of the selected feature extraction model, the type of hot spot measurement model, and the parameters of the selected hot spot measurement model. The optimization algorithm can include user defined heuristics and can be combination of nested optimizations (e.g., combinatorial and continuous optimization).

In a further aspect, measurement data from multiple, different targets is collected for model building, training, and measurement. The use of data associated with multiple targets having different structure, but formed by the same process conditions increases the information embedded in the model and reduces the correlation to process or other parameter variations. The additional information embedded in the model allows for a decoupling of information content associated with one parameter of interest from information associated with other parameters (e.g., film thicknesses, CD, etc.) that may affect the measured signals in a similar manner. In these examples, the use of training data that includes measurements of multiple, different targets at one or more measurement sites enables more accurate parameter estimation. In some examples, a mixture of isolated and dense line/space targets is employed to decouple overlay from underlayer effects. In some examples, multiple, different targets offset in orthogonal directions are employed in each die. This may be advantageous to minimize the effects of underlayers on measurement accuracy. In one example, SRAM device area can be used as one metrology target because it is sensitive to CD changes in combination with another metrology target sensitive to overlay.

In another further aspect, signals from multiple targets can be processed to reduce sensitivity to process variations and increase sensitivity to the parameters of interest. In some examples, signals from different targets are subtracted from one another. In some other examples, signals from different targets are fit to a model, and the residuals are used to build, train, and use the hot spot measurement model as described herein. In one example, signals from two different targets are subtracted to eliminate, or significantly reduce, the effect of process noise in each measurement result. In general, various mathematical operations can be applied between the signals from different targets to determine signals with reduced sensitivity to process variations and increased sensitivity to the parameters of interest.

In another further aspect, measurement data derived from measurements performed by a combination of multiple, different measurement techniques is collected for model building, training, and measurement. The use of measurement data associated with multiple, different measurement techniques increases the information content in the combined set of signals and reduces the correlation to process or other parameters variations. Measurement data may be derived from measurements performed by any combination of multiple, different measurement techniques. In this manner, different measurement sites may be measured by multiple, different measurement techniques (e.g., optical SE, imaging overlay, etc.) to enhance the measurement information available for estimation of parameters of interest.

In general, any measurement technique, or combination of two or more measurement techniques may be contemplated within the scope of this patent document as the data processed by the feature extraction model and the hot spot measurement model for training and measurement is in vector form. Because the signal response metrology techniques as described herein operate on vectors of data, each collected signal is treated independently. In addition, it is possible to concatenate data from multiple, different metrologies, regardless of whether the data is two dimensional data, one dimensional data, or even single point data.

Exemplary measurement techniques that may provide data for analysis in accordance with the signal response metrology techniques described herein include, but are not limited to imaging based measurement systems, spectroscopic ellipsometry, including Mueller matrix ellipsometry and ellipsometry with multiple angles of illumination, single wavelength ellipsometry, spectroscopic reflectometry, single wavelength reflectometry, spectroscopic scatterometry, scatterometry overlay, beam profile reflectometry, both angle-resolved and polarization-resolved, beam profile ellipsometry, single or multiple discrete wavelength ellipsometry, transmission small angle x-ray scatterometer (TSAXS), small angle x-ray scattering (SAXS), grazing incidence small angle x-ray scattering (GISAXS), wide angle x-ray scattering (WARS), x-ray reflectivity (XRR), x-ray diffraction (XRD), grazing incidence x-ray diffraction (GIXRD), high resolution x-ray diffraction (HRXRD), x-ray photoelectron spectroscopy (XPS), x-ray fluorescence (XRF), grazing incidence x-ray fluorescence (GIXRF), x-ray tomography, x-ray ellipsometry, scatterometry (e.g., speckle), Raman spectroscopy, scanning electron microscopy (SEM), transmission electron microscopy (TEM), and atomic force microscopy (AFM). In general, any metrology technique applicable to the characterization of semiconductor structures, including image based metrology techniques, may be contemplated, individually, or in any combination.

In another further aspect, signals measured by multiple metrologies can be processed to reduce sensitivity to process variations and increase sensitivity to the parameters of interest. In some examples, signals from targets measured by different metrologies are subtracted from one another. In some other examples, signals from targets measured by different metrologies are fit to a model, and the residuals are used to build, train, and use the measurement model as described herein. In one example, signals from a target measured by two different metrologies are subtracted to eliminate, or significantly reduce, the effect of process noise in each measurement result. In general, various mathematical operations can be applied between the signals measured by different metrologies to determine signals with reduced sensitivity to process variations and increased sensitivity to the parameters of interest.

In general, signals from multiple targets each measured by multiple metrology techniques increases the information content in the combined set of signals and reduces the correlation to process or other parameter variations.

In a further aspect, the methods and systems for training and measuring hot spot structures as described hereinbefore are implemented in a differential mode. In such a scheme the metrology target measurements and any associated reference measurements or simulations are performed at two distinct steps in the processing flow. The differences in the measured signals at each distinct processing step are treated as training signals for training purposes and measurement signals for measurement purposes.

In one example, the same location points are used for metrology target measurements at a lithography step and a subsequent etch step. The difference signal between the lithography and etch steps allows for monitoring of process variability on a per point site basis even if the structure varies between points on the wafer (e.g., due to process steps or small positioning errors). Such differential metrology mode may be preferred for metrology of SRAM device area where variations of the measurement target are present between different fields on the wafer.

In some examples, variations of the measurement target arise from a deficiency in the periodicity of the measured structures, e.g., finite structure size or in situations where the otherwise periodic structure is insufficiently repeated within the measurement spot of the metrology system. In some examples, variations of the measurement target arise from a small spot size of the optical metrology system and measurement location placement errors of the metrology system.

In some examples, the differences between actual device parameter values before and after one or more etch steps may be used as an input to the closed loop control of the etch process.

In general, differential hot spot monitoring allows for global (wafer), field (field average), or local (per site) results that can be used, for example, to set the target bias between two process monitoring steps (i.e., etch and lithography), provide per field correction, or provide high order correction (e.g., OVL or EPE control).

In yet another aspect, the hot spot measurement model results described herein can be used to provide active feedback to a process tool (e.g., lithography tool, etch tool, deposition tool, etc.). For example, values of hot spot parameters determined using the methods described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement model to provide active feedback to etch tools or deposition tools, respectively. In some example, corrections to process parameters determined based on a trained hot spot measurement model may be communicated to a lithography tool, etch tool, or deposition tool.

In general, the systems and methods described herein may be implemented as part of the process of preparing a measurement model for off-line or on-tool measurement.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A measurement system comprising:
   an illumination source configured to illuminate each of a plurality of metrology targets disposed a first plurality of locations on a wafer, the wafer also including a plurality of hot spot structures at a second plurality of locations on the wafer that are different from the first plurality of locations, the wafer being illuminated by the illumination source after an intermediate process step of a semiconductor wafer fabrication sequence;
   a detector configured to detect an amount of light from each of the plurality of metrology targets in response to the illuminating of each of the plurality of metrology targets and generate an amount of measurement data based on the detected amounts of light; and
   a computing system configured to:
      determine a value of at least one parameter characterizing a hot spot structure of the plurality of hot spot structures based on the amount of measurement data and a trained hot spot measurement model; and
      communicate a signal to a process tool that causes the process tool to adjust a process parameter associated with a fabrication process step of the semiconductor wafer fabrication sequence based on the value of the at least one parameter characterizing the hot spot structure.

2. The measurement system of claim 1, wherein the computing system is further configured to:
   receive an indication of the plurality of hot spot structures at the second plurality of locations on the wafer;
   receive an indication of the plurality of metrology targets at the first plurality of locations on the wafer;
   receive an indication of a process window associated with one or more process parameters associated with any process step prior to and including the intermediate process step;
   estimate a value of the at least one parameter characterizing the hot spot structure at each of a plurality of process points within the process window;
   determine an amount of measurement data associated with a measurement of each of the plurality of metrology targets at each of the plurality of process points within the process window; and
   train the hot spot measurement model based on the estimated value of the at least one parameter characterizing the hot spot structure at each of a plurality of process points within the process window and the amount of measurement data.

3. The measurement system of claim 2, wherein the estimating of the value of the at least one parameter characterizing the hot spot structure involves a simulation of a semiconductor fabrication model calibrated for the hot spot structure.

4. The measurement system of claim 2, wherein the estimating of the value of the at least one parameter characterizing the hot spot structure involves a measurement by a reference metrology system of the at least one parameter characterizing the hot spot structure repeatedly fabricated at each of a plurality of process points within the process window.

5. The measurement system of claim 2, wherein the one or more process parameters associated with the intermediate process step include lithography focus and lithography dosage.

6. The measurement system of claim 2, wherein the determining of the amount of measurement data associated with the measurement of each of the plurality of metrology targets involves a measurement of the plurality of metrology targets repeatedly fabricated at each of the plurality of process points within the process window.

7. The measurement system of claim 2, further comprising:
estimating a value of one or more parameters characterizing each of the plurality of metrology targets at each of the plurality of process points within the process window by a simulation of a semiconductor fabrication model, and wherein the determining the amount of measurement data associated with the measurement of each of the plurality of metrology targets is based on a simulation of a metrology target measurement model characterizing the measurement of each of the plurality of metrology targets by the measurement system at the value of the one or more parameters characterizing each of the plurality of metrology targets.

8. The measurement system of claim 1, wherein the plurality of hot spot structures include relatively dense structures and relatively isolated structures.

9. The measurement system of claim 1, wherein at least one of the plurality of metrology targets is an actual device structure.

10. The measurement system of claim 9, wherein the plurality of metrology targets includes any of a line-space grating, a FinFET structure, a SRAM device structure, a Flash structure, and a DRAM memory structure.

11. The measurement system of claim 1, wherein the hot spot measurement model is any of a linear model, a non-linear model, a polynomial model, a neural network model, a support vector machines model, a decision tree model, and a random forest model.

12. The measurement system of claim 1, wherein the plurality of metrology targets and the plurality of hot spot targets are the same type of structure.

13. The measurement system of claim 1, wherein the illuminating of each of the plurality of metrology targets and the detecting of the amount of light from each of the plurality of metrology targets includes measurements acquired by a plurality of different metrology techniques.

14. A measurement system comprising:
an illumination source configured to illuminate each of a plurality of metrology targets disposed a first plurality of locations on a wafer, the wafer also including a plurality of hot spot structures at a second plurality of locations on the wafer that are different from the first plurality of locations, the wafer being illuminated by the illumination source after an intermediate process step of a semiconductor wafer fabrication sequence;
a detector configured to detect an amount of light from each of the plurality of metrology targets in response to the illuminating of each of the plurality of metrology targets and generate an amount of measurement data based on the detected amounts of light; and
a non-transitory computer readable medium storing an amount of program code that when executed by a computing system causes the computing system to:
determine a value of at least one parameter characterizing a hot spot structure of the plurality of hot spot structures based on the amount of measurement data and a trained hot spot measurement model; and
communicate a signal to a process tool that causes the process tool to adjust a process parameter associated with a fabrication process step of the semiconductor wafer fabrication sequence based on the value of the at least one parameter characterizing the hot spot structure.

15. The measurement system of claim 14, wherein the amount of program code further causes the computing system to:
receive an indication of the plurality of hot spot structures at the second plurality of locations on the wafer;
receive an indication of the plurality of metrology targets at the first plurality of locations on the wafer;
receive an indication of a process window associated with one or more process parameters associated with any process step prior to and including the intermediate process step;
estimate a value of the at least one parameter characterizing the hot spot structure at each of a plurality of process points within the process window;
determine an amount of measurement data associated with a measurement of each of the plurality of metrology targets at each of the plurality of process points within the process window; and
train the hot spot measurement model based on the estimated value of the at least one parameter characterizing the hot spot structure at each of a plurality of process points within the process window and the amount of measurement data.

16. A method comprising:
providing a wafer to a measurement system after an intermediate process step of a semiconductor wafer fabrication sequence, the wafer including a plurality of hot spot structures at a first plurality of locations on the wafer and a plurality of metrology targets at a second plurality of locations on the wafer that are different from the first plurality of locations;
illuminating each of the plurality of metrology targets at the second plurality of locations;
detecting an amount of light from each of the plurality of metrology targets in response to the illuminating of each of the plurality of metrology targets and generating an amount of measurement data based on the detected amounts of light;
determining a value of at least one parameter characterizing a hot spot structure by a computing system based on the amount of measurement data and a trained hot spot measurement model; and
communicating a signal to a process tool that causes the process tool to adjust a process parameter associated with a fabrication process step of the semiconductor wafer fabrication sequence based on the value of the at least one parameter characterizing the hot spot structure.

17. The method of claim 16, further comprising:
receiving an indication of the plurality of hot spot structures at the first plurality of locations on the wafer;
receiving an indication of the plurality of metrology targets at the second plurality of locations on the wafer;
receiving an indication of a process window associated with one or more process parameters associated with any process step prior to and including the intermediate process step;
estimating a value of the at least one parameter characterizing a hot spot structure of the plurality of hot spot structures at each of a plurality of process points within the process window by the computing system;

determining an amount of measurement data associated with a measurement of each of the plurality of metrology targets at each of the plurality of process points within the process window by the computing system; and training the hot spot measurement model based on the estimated value of the at least one parameter characterizing the hot spot structure at each of a plurality of process points within the process window and the amount of measurement data by the computing system.

18. The method of claim 17, wherein the estimating of the value of the at least one parameter characterizing the hot spot structure involves a simulation of a semiconductor fabrication model calibrated for the hot spot structure.

19. The method of claim 17, wherein the one or more process parameters associated with the intermediate process step include lithography focus and lithography dosage.

20. The method of claim 16, wherein at least one of the plurality of metrology targets is an actual device structure.

* * * * *